United States Patent
Li et al.

(10) Patent No.: US 10,277,195 B2
(45) Date of Patent: Apr. 30, 2019

(54) ELECTRO-ACOUSTIC TRANSDUCER AND ELECTRO-ACOUSTIC COMPONENT COMPRISING AN ELECTRO-ACOUSTIC TRANSDUCER

(71) Applicant: SNAPTRACK, INC., San Diego, CA (US)

(72) Inventors: Xian Yi Li, Singapore (SG); Stéphane Chamaly, Mouans-Sartoux (FR); Sok Fong Koh, Singapore (SG)

(73) Assignee: SnapTrack, Inc., San Diego, CA (US)

( * ) Notice: Subject to any disclaimer, the term of this patent is extended or adjusted under 35 U.S.C. 154(b) by 85 days.

(21) Appl. No.: 15/314,087

(22) PCT Filed: Jun. 24, 2014

(86) PCT No.: PCT/EP2014/063296
§ 371 (c)(1),
(2) Date: Nov. 27, 2016

(87) PCT Pub. No.: WO2015/197111
PCT Pub. Date: Dec. 30, 2015

(65) Prior Publication Data
US 2018/0062610 A1    Mar. 1, 2018

(51) Int. Cl.
*H03H 9/02* (2006.01)
*H03H 9/145* (2006.01)
(Continued)

(52) U.S. Cl.
CPC .... *H03H 9/02866* (2013.01); *H03H 9/02574* (2013.01); *H03H 9/02881* (2013.01);
(Continued)

(58) Field of Classification Search
CPC .............. H03H 9/6489; H03H 9/6423; H03H 9/02574; H03H 9/02881; H03H 9/14544
(Continued)

(56) References Cited

U.S. PATENT DOCUMENTS

| | | | |
|---|---|---|---|
| 2004/0130411 A1* | 7/2004 | Beaudin | H03H 9/14547 333/133 |
| 2004/0246076 A1 | 12/2004 | Bergmann | |

(Continued)

FOREIGN PATENT DOCUMENTS

| | | |
|---|---|---|
| DE | 102004036970 A1 | 2/2006 |
| EP | 1489741 A1 | 12/2004 |

(Continued)

OTHER PUBLICATIONS

International Search Report and Written Opinion—PCT/EP2014/063296—ISA/EPO—dated Mar. 20, 2015.

*Primary Examiner* — Benny T Lee
*Assistant Examiner* — Hafizur Rahman
(74) *Attorney, Agent, or Firm* — Patterson & Sherian, L.L.P.

(57) ABSTRACT

An electro-acoustic transducer and an electro-acoustic component including an electro-acoustic transducer are disclosed. In an embodiment the transducer includes a first and a second bus bar, a plurality of electrode fingers and a plurality of two or more sub tracks, wherein each electrode finger is electrically connected to one of the bus bars, wherein each sub track extends along a longitudinal direction, wherein all sub tracks are arranged one next to another in a transversal direction, wherein at least a first of the sub tracks includes segments of the electrode fingers and has an associated sub track with segments of the electrode fingers, wherein the segments of the electrode fingers of the first sub track are shifted by a distance $S=\lambda/2$ along the longitudinal direction relative to the segments of the electrode fingers of the associated sub track, and wherein $\lambda$ is an acoustic wavelength.

14 Claims, 4 Drawing Sheets

(51) Int. Cl.
*H03H 9/64* (2006.01)
*H03H 9/72* (2006.01)

(52) U.S. Cl.
CPC .... *H03H 9/14544* (2013.01); *H03H 9/14547* (2013.01); *H03H 9/14567* (2013.01); *H03H 9/643* (2013.01); *H03H 9/6426* (2013.01); *H03H 9/6493* (2013.01); *H03H 9/02551* (2013.01); *H03H 9/02559* (2013.01); *H03H 9/725* (2013.01)

(58) Field of Classification Search
USPC .................................................. 333/193–196
See application file for complete search history.

(56) References Cited

U.S. PATENT DOCUMENTS

2006/0017524 A1* 1/2006 Yoneya ............... H03H 9/14564
333/195
2009/0085692 A1* 4/2009 Tsuda ................. H03H 9/14547
333/193

FOREIGN PATENT DOCUMENTS

| JP | 5142446 A | 4/1976 |
| JP | 2006287680 A | 10/2006 |
| JP | 2006303841 A | 11/2006 |

\* cited by examiner

ELECTRO-ACOUSTIC TRANSDUCER AND ELECTRO-ACOUSTIC COMPONENT COMPRISING AN ELECTRO-ACOUSTIC TRANSDUCER

This patent application is a national phase filing under section 371 of PCT/EP2014/063296, filed Jun. 24, 2014, which is incorporated herein by reference in its entirety.

TECHNICAL FIELD

The present invention refers to electro-acoustic transducers with reduced emission of acoustic waves and to components, e.g. RF-filter components, comprising such transducers.

BACKGROUND

Electro-acoustic transducers can be utilized in RF-filter components, e.g. for mobile communication devices. RF-filters comprising electro-acoustic transducers work with acoustic waves. Due to the slower velocity of acoustic waves compared to electro-magnetic waves, spatial dimensions are minimized. Electro-acoustic components comprised by such filters may work with SAW (SAW=Surface Acoustic Wave), GBAW (GBAW=Guided Bulk Acoustic Wave), or BAW (BAW=Bulk Acoustic Wave). However, although transducers working with SAW, GBAW, or BAW have already reached a high integration density, further size reduction is of more and more importance as they are used in consumer products which tend to provide more and more functionalities.

One problem of components with increased integration density is mutual interaction between closely arranged transducers.

SUMMARY OF THE INVENTION

Embodiments of the invention provide an electro-acoustic transducer which allows further miniaturization and provide electro-acoustic components comprising electro-acoustic transducers.

In various embodiments an electro-acoustic transducer comprises a first and second bus bar. The transducer further comprises a plurality of electrode fingers and a plurality of two or more subtracks. As in conventional transducers, each electrode finger may be electrically connected to one of the two bus bars. Each subtrack extends along a longitudinal direction and all subtracks are arranged one next to another in a transversal direction. At least a first of the subtracks comprises segments of the electrode fingers and has an associated subtrack included in the plurality of subtracks where the associated subtrack has also segments of electrode fingers. The segments of the electrode fingers of the first subtrack are shifted a distance $S=\lambda/2$ along the longitudinal direction relative to the segments of the electrode fingers of the associated subtrack. Here, $\lambda$ is the acoustic wave length of the acoustic waves that may be excited by the structure of the electrode fingers.

Transducers such as SAW transducers utilizing a leaky wave mode need to radiate acoustic waves such as SAW or BAW to fulfill boundary conditions. Such radiated waves may leave the transducer in the longitudinal direction, which is the direction of propagation of the conventionally excited waves in the transducer. If another transducer is arranged along the longitudinal direction next to the present transducer, then these radiated waves may enter the further transducer resulting in an unwanted acoustic coupling between transducers. This coupling causes deteriorated electrical properties and the signal quality of a filter with such transducers, especially in a rejection band, is jeopardized. For example, BAW radiated from a first transducer may be reflected at the bottom surface of a piezoelectric substrate and enter a second transducer arranged on the same substrate side as the first transducer.

The above-described transducer has a first subtrack that may radiate waves unwanted in another transducer. However, the transducer further has an associated subtrack which also may radiate unwanted waves which have—due to the shifted distance $S=\lambda/2$—a phase shift of 180° relative to the radiated waves of the first subtrack. Wherever both waves of the first subtrack and of the first subtrack's associated subtrack arrive at the same time, an essentially destructive interference is obtained and an unwanted acoustic coupling between adjacent transducers is eliminated or at least strongly reduced.

However, an according RF-filter's insertion loss may be increased because conductor structures electrically connecting the corresponding segments of the electrode fingers of the different subtracks may lead to diffraction.

However, if the present transducer is designed properly, then the positive effects overweigh the negative effects and an improved transducer is obtained which allows improved RF-filter components.

The number of subtracks within the electro-acoustic transducer is not limited as long as at least one subtrack, the first subtrack, has its associated subtrack as described above. It is, however, possible that a plurality of subtracks is present where each of the subtracks has its own associated subtrack. For example, if the number N of subtracks is an even number, then N/2 pairs of subtracks—each canceling the effect of the respective associated subtrack—may be present. A subtrack and its associated subtrack may be arranged directly one next to the other. However, it is possible that one or more other subtracks are arranged between the subtrack and its associated subtrack. For example, it is possible that approximately half of the subtracks are arranged between a subtrack and its associated subtrack. To be more precise: it is possible that if N is the number of subtracks, then N/2−1 subtracks may be arranged between each subtrack and its corresponding associated subtrack.

As in conventional transducers, the bus bars and the electrode fingers, and their corresponding segments, are arranged on a piezoelectric material which may be a monocrystalline substrate. The piezoelectric material may comprise LiTaO$_3$ (lithium tantalate), LiNbO$_3$ (lithium niobate), and/or quartz.

The acoustic waves utilized by the transducer may be Rayleigh waves, leaky waves, SH-waves (Sheer Horizontal waves), and other conventionally used acoustic waves.

The present concept of reducing detrimental effects of radiated waves is independent from material parameters. Thus, the present concept can be applied to every conventional transducer. Thus, the conventionally known Euler angles defining the direction of propagation of the waves can be used.

Especially an LT42 piezoelectric substrate is suited to carry the bus bars and the electrode fingers. An LT42 substrate is a LiNbO$_3$ substrate with a 42 RY cut.

Thus, it is especially possible that the transducer is dedicated to utilize a leaky wave mode. Thus, leaky wave mode is excited when the transducer is active.

Each electrode finger electrically connected to one of the two bus bars is, thus, connected to an electric potential.

Neighboring electrode fingers which are connected to different bus bars are utilized due to the piezoelectric effect to convert an RF-signal into an acoustic wave or vice-versa. However, the electrode finger has segments which may be shifted along the longitudinal direction according to their affiliation of the corresponding subtrack.

Thus, it is possible that slanted conductor segments electrically connect the respective finger segments of a finger where the segments belong to different but adjacent subtracks. These slanted conductor segments are, thus, oriented in an angle relative to the longitudinal direction which depends on the relative shift along the longitudinal direction and on the distance along a transversal direction between adjacent subtracks.

The slanted finger segments may comprise the same material as the finger segments of the electrode fingers in the subtracks. However, the density of the slanted finger segments and/or the metallization ratio η of the slanted finger segments may vary from the corresponding values of the finger segments in the subtracks.

It is possible that the number of subtracks is 2, 3, 4, 5, 6, 7, 8, 9 or 10. However, an even number of subtracks is preferred.

It is further possible that the number N of subtracks is increased to 100, 1,000, 1,000,000, essentially infinity—with a corresponding decrease of the width of the respective subtracks—while the shift of adjacent subtracks is also reduced. Then, also the distance between adjacent subtracks may be reduced. When the transition N→infinity is reached, then a transducer is obtained in which the electro-acoustic active region of the transducer is covered by electro-acoustically active slanted electrode fingers.

Thus, it is possible that slanted finger segments establish an infinite number of directly adjacent subtracks with according infinitively small width.

It is possible that the shift of one end of the electrode fingers relative to the other end of the electrode fingers is λ along the longitudinal direction.

With a total shift of λ, it is easy to obtain a plurality of N/2 subtracks and their corresponding associated subtracks with a relative phase shift of λ/2.

It is possible that each subtrack has its associated subtrack with a shifted distance S=λ/2.

It is possible that the distance D along the transversal direction between adjacent subtracks equals 4λ or 6λ or values between 4λ and 6λ. Especially, it is possible that the number of subtracks is 2 and both subtracks, the first subtrack and its associated subtrack, are divided by a distance 4λ≤D≤6λ.

It is possible that the transducer is arranged next to another transducer. The other transducer may be arranged in a longitudinal direction next to the transducer built as described above.

However, it is also possible that a first transducer has a phase shift of 90° between a subtrack and its associated subtrack and the other transducer also has correspondingly arranged subtracks with a phase shift of 90° between a transducer and its associated transducer in such a way that the phase shifts of the first transducer and the phase shift of the other transducer add up to 180°, resulting in a destructive interference.

It is further possible and wanted that acoustic waves leaving the first subtrack in a longitudinal direction and acoustic waves leaving the first subtrack's associated subtrack interfere destructively, especially at a position where another electro-acoustic filter element is arranged.

It is possible that different metallization rations η of the first subtrack and an intermediate section between the first subtrack and the first subtrack's associated subtrack establish a wave guiding structure. It is further possible that such a wave guiding structure is obtained by a different mass loading which may be obtained by a different density of the electrode material or by a further material deposited in the subtracks or in the stripes between the subtracks.

The velocity of acoustic waves depends—among other parameters such as Young's modules of the substrate material—on the mass loading of metal at the surface of the piezoelectric material. At an interface where the velocity of acoustic waves changes, diffraction effects take place. Such an interface may be the interface between a subtrack and an adjacent subtrack or a subtrack and a stripe between adjacent subtracks with slanted finger segments. Thus, although diffraction effects deteriorate the insertion loss, especially in the pass band of a band pass filter, a wave guiding structure can be obtained in which an emission of acoustic waves in a transversal direction is reduced. Further, it is possible that wanted acoustic modes such as a piston mode can be obtained or the degree of purity of a piston mode can be increased.

It is possible that the transducer is comprised by an electro-acoustic component which comprises the transducer and one or more further transducers. Especially, it is possible that an electro-acoustic component comprises two transducers of which at least one transducer is a transducer as described above. With such a transducer and a conventional transducer arranged next to the transducer, especially in a longitudinal direction, an acoustic coupling between the transducers is minimized.

It is further possible that a component comprises two further transducers where the four transducers are arranged in a two-by-two matrix layout. Two of the transducers, especially arranged next to another in a transversal direction, are of the type as described above.

BRIEF DESCRIPTION OF THE DRAWINGS

The working principle of the transducer and non-limiting embodiments are described in the schematic figures.

DETAILED DESCRIPTION OF ILLUSTRATIVE EMBODIMENTS

Figure 1:
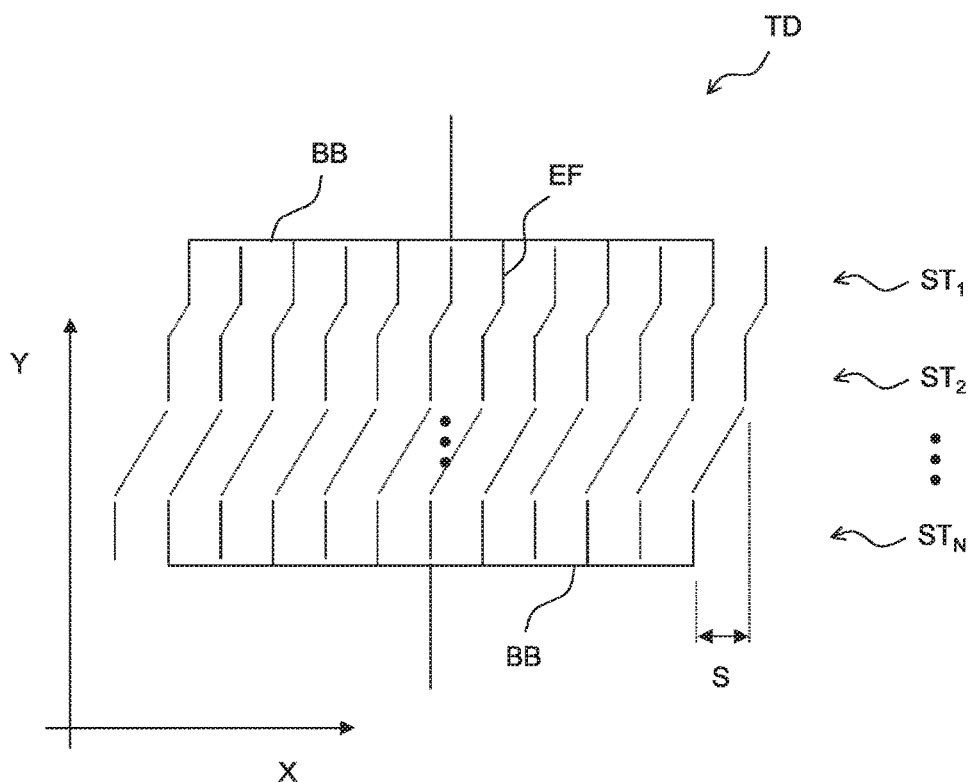
FIG. 1 illustrates a transducer with N subtracks and the relation of the longitudinal direction X and of the transversal direction Y relative to the orientation of the transducer.

FIG. 1 shows a transducer TD comprising two bus bars BB. A plurality of electrode fingers EF is connected in such a way that each electrode finger EF is connected to exactly one of the two bus bars BB. The transducer comprises a plurality of N subtracks. The subtracks are electro-acoustic active regions of the transducer. Each subtrack has segments of electrode fingers perpendicular to the bus bars BB. The segments of the electrode fingers of the corresponding subtracks are electrically connected to respective corresponding segments of adjacent subtracks by slanted conductor structures. Adjacent electrode fingers electrically connected to different bus bars transform RF-signals applied to the bus bars to acoustic waves and vice-versa. The acoustic velocity and the distance between adjacent electrode fingers mainly determine a resonance frequency and an anti-resonance frequency of the transducer. The acoustic waves excited by the electrode fingers propagate along the longitudinal direction X. The subtracks ST, thus, establish stripes extending along the longitudinal direction X and the stripes of adjacent subtracks are arranged one next to another in the transversal direction Y. For at least one of the subtracks, the first subtrack and its associated subtrack the shift S along the longitudinal direction X equals $\lambda/2$. Acoustic waves emitted by the first track, here $ST_2$, and its associated subtrack, here STN, interfere destructively at a position along the longitudinal direction X where another transducer may be arranged. The number N is mainly not limited. An increase of N and a transition into infinity results in a transducer as shown in FIG. 3.

Figure 2:
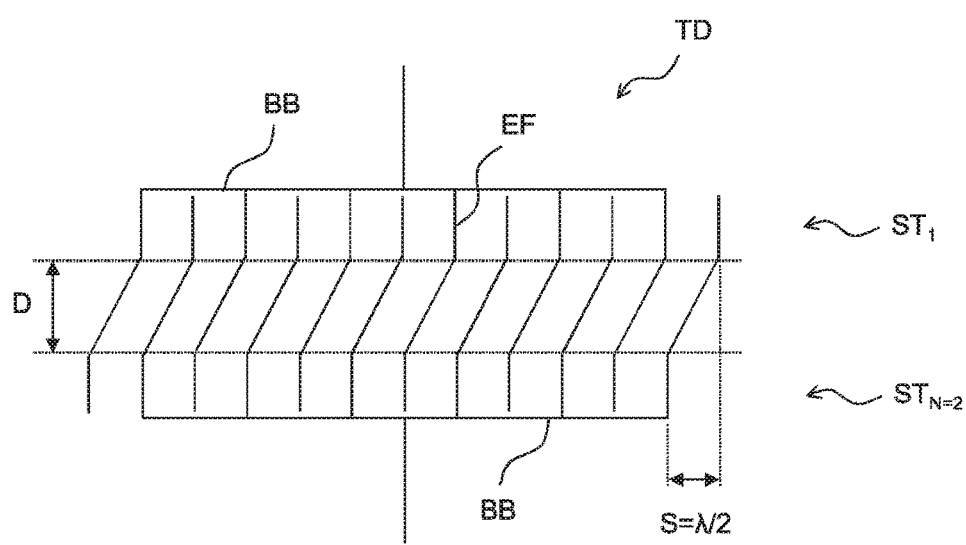
FIG. 2 shows an embodiment with two subtracks.

FIG. 2 shows a transducer TD having two subtracks $ST_1$ and $ST_2$. Thus, the total number of subtracks N equals 2. The shift between the two subtracks along the longitudinal direction X equals $\lambda/2$. The distance between the two subtracks along the transversal direction Y is denoted as D.

Figure 3:
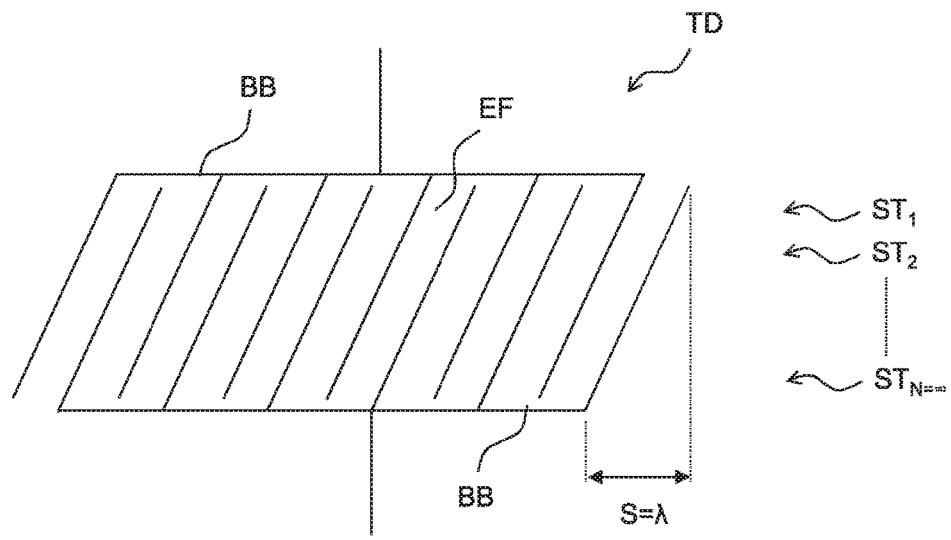
FIG. 3 shows an embodiment with a virtually infinite number (N=infinity) of subtracks realized by slanted electrode fingers.

FIG. 3 shows a transducer TD which is obtained mathematically by a transition N→∞ and which is obtained by arranging slanted electrode fingers which have an angle other than 90° relative to the extension of the bus bars. The shift S along the longitudinal direction X between two finger ends of each finger is preferably $\lambda$.

Figure 4:
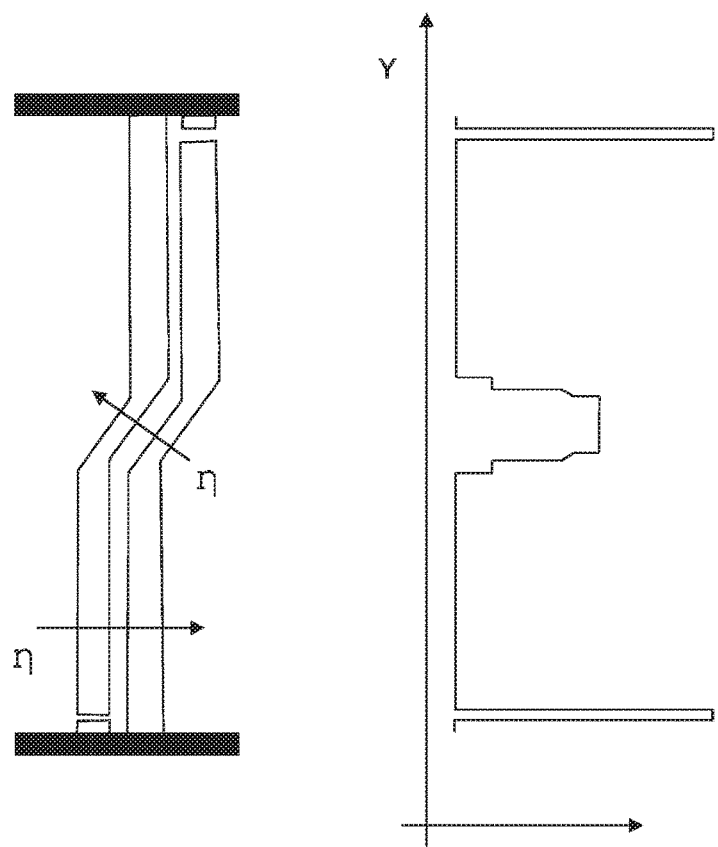
FIG. 4 illustrates the concept of a wave guiding structure.

FIG. 4 shows the concept of building a wave guiding structure by varying the mass loading in different sections of the acoustic track. Here, the number of subtracks is N=2 and the metallization ratio $\eta$ in the region between the two subtracks is chosen relative to the metallization ratio $\eta$ in the two subtracks in such a way that the wave velocity V is increased between the two subtracks along the transversal direction Y. Further, stub fingers can be connected to the respective bus bars to further form the wave guiding structure. The wave velocity may have a maximum value in a gap region, i.e. in the region separating an electrode finger of one polarity from the electrode structure of the respective opposite polarity.

Figure 5:
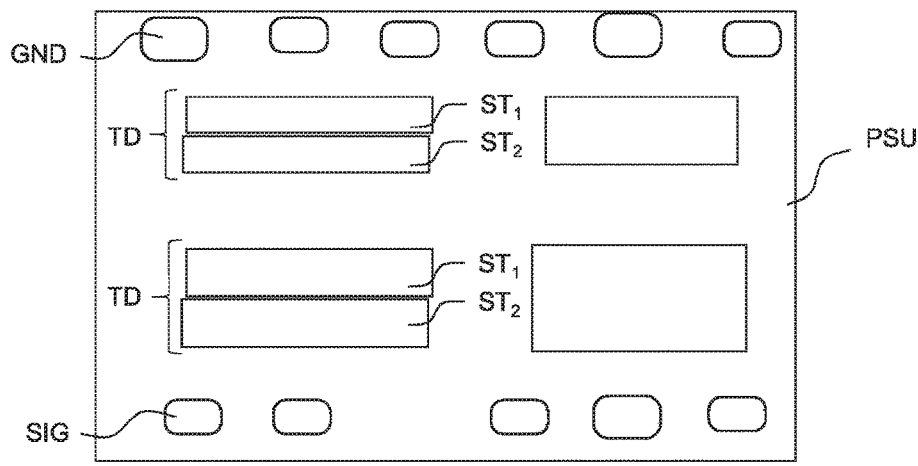
FIG. 5 illustrates the application to an RF-filter with four transducers.

FIG. 5 shows a concept of a layout of a piezoelectric substrate PSU on which transducers according to the above ideas TD are arranged. Each transducer TD comprises a first subtrack $ST_1$ and a second subtrack $ST_2$ mainly shifted by a distance of $\lambda/2$ along the longitudinal direction. Positioned next to the two transducers on the right-hand side and at a position along the longitudinal direction are arranged further transducers which may be electrically connected to the transducers on the left-hand side. In any case, the transducers on the right-hand side are acoustically coupled to the transducers on the left-hand side, but due to the split-track nature of the transducers on the left-hand side, the negative influences of the acoustic coupling is vastly decreased.

The piezoelectric substrate PSU may comprise further contact pads for ground connections GND or for signal connections SIG.

Thus, with the present concept, the distances between adjacent transducers can be minimized while the negative effects of acoustic coupling are reduced.

Figure 6:
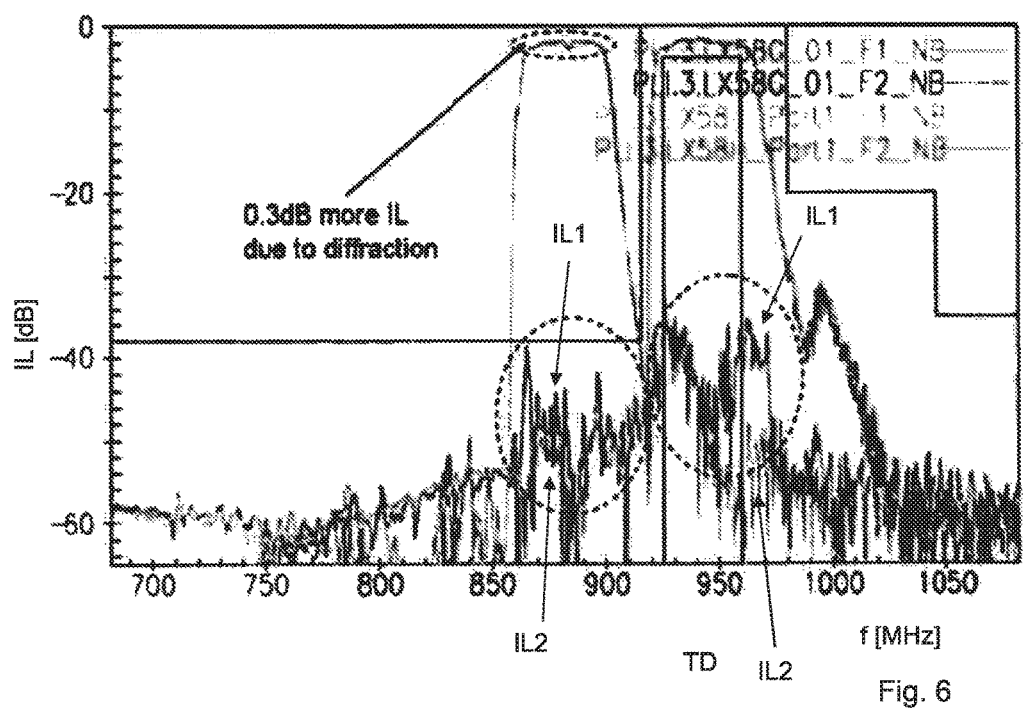
FIG. 6 shows a graph of improvements in the out-of-band rejection obtained by an improved transducer.

FIG. 6 shows the frequency dependent insertion loss (matrix element $S_{21}$) of a duplexer comprising transducers as described above. For comparison, the insertion loss of the conventional duplexer is also shown. Although the improved duplexer has 0.3 dB more insertion loss due to diffraction effects in the pass band spikes in the corresponding rejection band of the conventional duplexer (curve IL1) are reduced or eliminated (curve IL2).

FIG. 6 shows the curves for a band V filter and for a band VIII filter.

Figure 7:
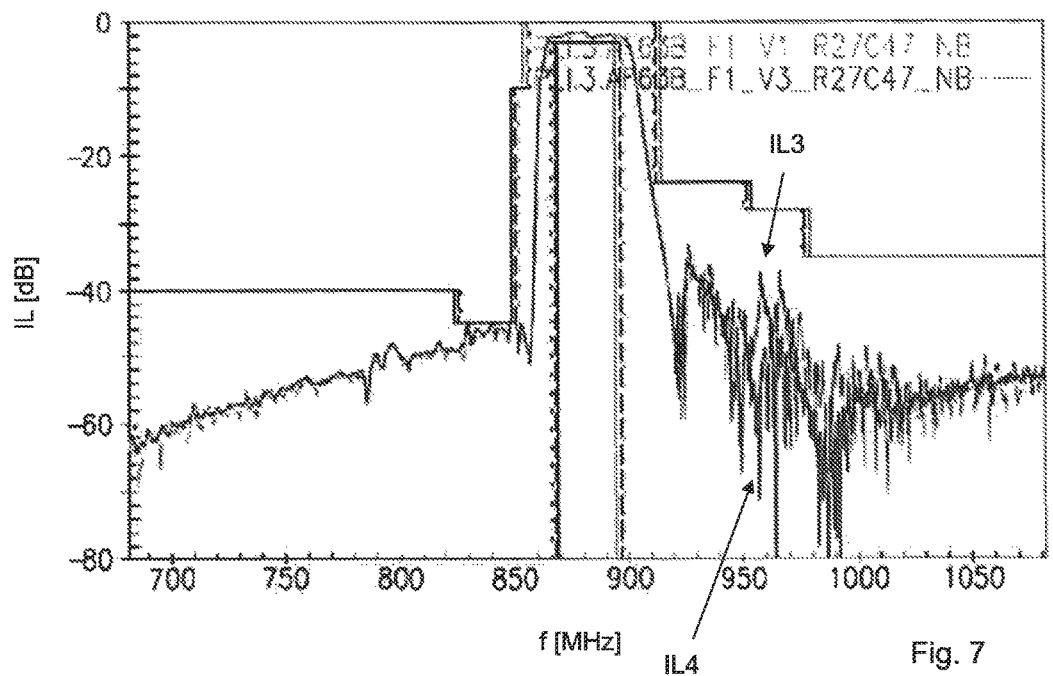
FIG. 7 shows a graph of further positive aspects of improved transducers.

Similar improvements are shown in FIG. 7 where curve IL3 shows the insertion loss of a conventional band V filter while curve IL4 shows the insertion loss of an improved band pass filter comprising a transducer with slanted electrode fingers, e.g. with an infinite number of subtracks.

Figure 8:
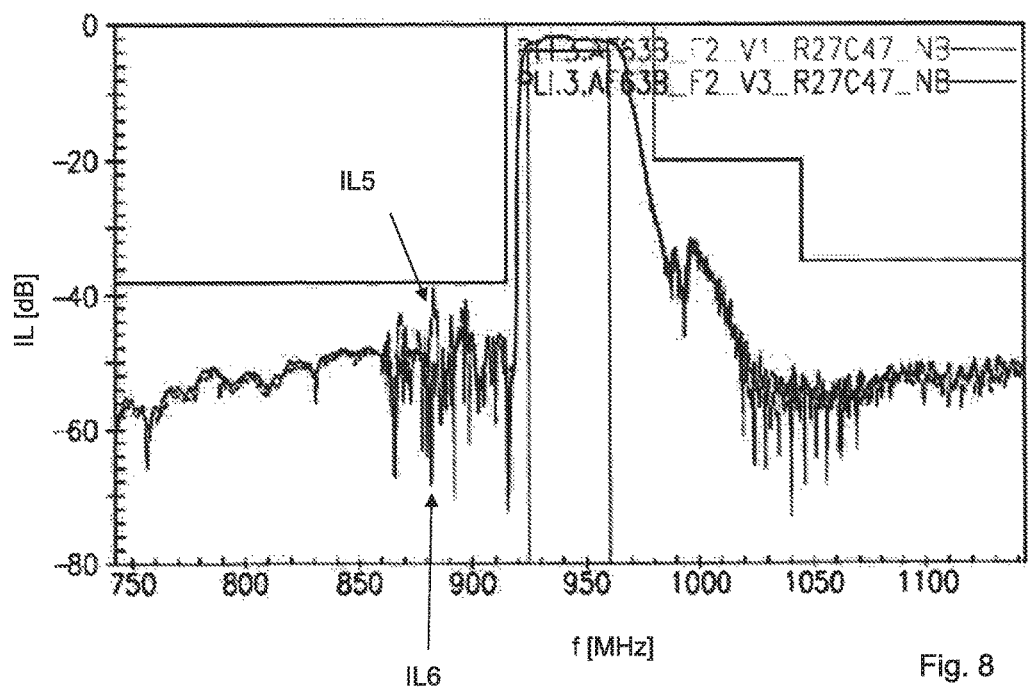
FIG. 8 shows a graph of further positive aspects of improved transducers.

Further, FIG. 8 shows the improvement in a frequency range below a pass band where curve IL5 shows the insertion loss of a conventional band pass filter, whereas curve IL6 shows the insertion loss for an improved band VIII filter with slanted electrode fingers.

The present concept is not restricted to described embodiments or transducers or components shown in the figures. Transducers and/or components comprising further electrode structures such as reflectors, dummy fingers, split finger electrodes, etc. are also comprised.

The invention claimed is:

1. An electroacoustic transducer comprising:
   a first bus bar and a second bus bar;
   a first plurality of electrode fingers and a second plurality of electrode fingers; and
   a plurality of sub tracks,
   wherein each of the first plurality of electrode fingers is electrically connected to the first bus bar and each of the second plurality of electrode fingers is electrically connected to the second bus bar,
   wherein each sub track extends along a longitudinal direction,
   wherein all sub tracks are arranged one next to another in a transversal direction,
   wherein at least a first of the sub tracks comprises segments of the first plurality and second plurality of electrode fingers and has an associated sub track with segments of the first plurality and second plurality of electrode fingers,
   wherein the segments of the first sub track are shifted by a distance $S=\lambda/2$ along the longitudinal direction relative to the segments of the associated sub track,
   wherein a distance (D) between adjacent sub tracks is $4\lambda \leq D \leq 6\lambda$ in the transversal direction, and
   wherein $\lambda$ is an acoustic wavelength.

2. The transducer of claim 1, wherein the first and second bus bars and the first plurality and second plurality of electrode fingers are arranged on a piezoelectric substrate comprising $LiTaO_3$, $LiNbO_3$ and/or Quartz.

3. The transducer of claim 1, wherein the first and second bus bars and the first plurality and second plurality of electrode fingers are arranged on a LT42 piezoelectric substrate.

4. The transducer of claim 1, wherein the transducer is configured to utilize a leaky wave mode.

5. The transducer of claim 1, further comprising slanted conductor segments as electrical connections between the segments of adjacent sub tracks.

6. The transducer of claim 1, wherein the transducer comprises 2-10 sub tracks.

7. The transducer of claim 1, wherein each of the plurality of sub tracks has an associated sub track within a shifted distance $S=\lambda/2$ along the longitudinal direction.

8. The transducer of claim 1, wherein the transducer is arranged next to another transducer.

9. The transducer of claim 1, wherein different metallization ratios $\eta$ of the first sub track and an intermediate section between the first sub track and the associated sub track establish a wave guiding structure.

10. An electroacoustic component comprising: two transducers wherein at least one transducer is the transducer of claim 1.

11. The component of claim 10, further comprising two additional transducers, wherein the transducers are arranged in a 2×2 matrix layout.

12. An electroacoustic component, comprising:
a first bus bar and a second bus bar;
a first plurality of electrode fingers and a second plurality of electrode fingers; and
a plurality of sub tracks,
wherein each of the first plurality of electrode fingers is electrically connected to the first bus bar and each of the second plurality of electrode fingers is electrically connected to the second bus bar,
wherein each sub track extends along a longitudinal direction,
wherein all sub tracks are arranged one next to another in a transversal direction,
wherein at least a first of the sub tracks comprises segments of the first plurality and second plurality of electrode fingers and has an associated sub track with segments of the first plurality and second plurality of electrode fingers,
wherein the segments of the first sub track are shifted by a distance $S=\lambda/2$ along the longitudinal direction relative to the segments of the associated sub track,
wherein $\lambda$ is an acoustic wavelength, and
wherein acoustic waves configured to leave the first sub track in the longitudinal direction and acoustic waves configured to leave the associated sub track interfere destructively.

13. An electroacoustic transducer comprising:
a first bus bar and a second bus bar;
a first plurality of electrode fingers and a second plurality of electrode fingers; and
a plurality of sub tracks,
wherein each of the first plurality of electrode finger is electrically connected to the first bus bar and each of the second plurality of electrode fingers is electrically connected to the second bus bar,
wherein each sub track extends along a longitudinal direction,
wherein all sub tracks are arranged one next to another in a transversal direction,
wherein at least a first of the sub tracks comprises segments of the first plurality and second plurality of electrode fingers and has an associated sub track with segments of the first plurality and second plurality of electrode fingers,
wherein the segments of the first sub track are shifted a distance $S=\lambda/2$ along the longitudinal direction relative to the segments of the associated sub track,
wherein $\lambda$ is an acoustic wavelength,
wherein the first and second bus bars and the first plurality and second plurality of electrode fingers are arranged on a LT42 piezoelectric substrate, and
wherein the transducer is configured to utilize a leaky wave mode.

14. The transducer of claim 13, where a distance D between adjacent sub tracks is: $4\lambda \leq D \leq 6\lambda$ in the transversal direction.

* * * * *